(12) United States Patent
Wakuda et al.

(10) Patent No.: US 7,336,077 B2
(45) Date of Patent: Feb. 26, 2008

(54) MAGNET FOR NMR ANALYZER AND NMR ANALYZER USING THE SAME

(75) Inventors: Tsuyoshi Wakuda, Hitachi (JP); Michiya Okada, Mito (JP); Tomomi Kikuta, Hitachi (JP); Kohji Maki, Hitachi (JP); Hiroshi Morita, Hitachi (JP); Shuichi Kido, Hitachi (JP); Tomoo Chiba, Hitachi (JP); Hideo Tsukamoto, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/600,039

(22) Filed: Nov. 16, 2006

(65) Prior Publication Data

US 2007/0052421 A1 Mar. 8, 2007

Related U.S. Application Data

(63) Continuation of application No. 11/330,185, filed on Jan. 12, 2006, now Pat. No. 7,187,175, which is a continuation of application No. 10/815,706, filed on Apr. 2, 2004, now Pat. No. 7,141,977.

(30) Foreign Application Priority Data

Apr. 3, 2003 (JP) ............................. 2003-100120

(51) Int. Cl.
*G01V 3/00* (2006.01)
(52) U.S. Cl. ...................... 324/321; 324/319
(58) Field of Classification Search ................ 324/321, 324/319; 335/216, 296
See application file for complete search history.

(56) References Cited

U.S. PATENT DOCUMENTS 3,388,322 A 6/1968 Kaukien
5,168,211 A 12/1992 Laukien
5,319,333 A * 6/1994 Roth et al. ................... 335/216
5,739,689 A 4/1998 Roth
6,289,681 B1 * 9/2001 Eckels et al. ................. 62/47.1
6,570,475 B1 5/2003 Lvovsky
6,859,036 B2 2/2005 Aihara

FOREIGN PATENT DOCUMENTS

| EP | 0 561 552 | 9/1993 |
|----|-----------|--------|
| EP | 1 361 454 | 11/2003 |
| JP | 4-504067  | 2/1992 |
| JP | 7-240310  | 9/1995 |
| JP | 7-333311  | 12/1995 |

OTHER PUBLICATIONS

Y. Arata, "Document about NMR", published by Maruzen Publishing Co. Ltd. 2000, pp. 324-327.
Spectromag Magneto-Optical Superconducting Magnet System 1999, pp. 1-8.

(Continued)

*Primary Examiner*—Louis M. Arana
(74) *Attorney, Agent, or Firm*—Antonelli, Terry, Stout & Kraus, LLP.

(57) ABSTRACT

A magnet for an NMR analyzer includes a superconductor coil for generating a magnetic field in a magnetic space surrounded by the superconductor coil. The superconductor coil has a shim coil group disposed at least one of inside and outside of the superconducting coil. The superconducting coil provides a first access port for receiving a probe inserted into the magnetic space along a central axis thereof and a second access port having one end for receiving a sample tube containing a sample inserted into the magnetic space in a direction transverse to the central axis of the magnetic space. The second access port is open at an other end thereof.

14 Claims, 5 Drawing Sheets

OTHER PUBLICATIONS

Kitaguchi "Development of A New-Type NMR Spectrometer with Ultrahigh Sensitivity" May 13, 2003.

Radial Access Port Magnets (Split Coils) http:www.americanmagnetics.com, Aug. 11, 2002.

Development of Superconductor Magnet for High-Field NMR; Hirose et al; Applied Physics, vol. 66, No. 1 (1997) pp. 20-23.

Radial Access Port Magnets (Split Coils), http://web.archive.org/web: www.americanmagnetics.co; Dec. 1997-1998.

* cited by examiner

DIRECTION OF THE MAGNETIC FIELD

MAGNET FOR NMR ANALYZER AND NMR ANALYZER USING THE SAME

CROSS REFERENCE TO RELATED APPLICATION

This application is a continuation of U.S. Ser. No. 11/330,185, filed Jan. 12, 2006, now U.S. Pat. No. 7,187,175, which is a continuation of U.S. Ser. No. 10/815,706, filed Apr. 2, 2004, now U.S. Pat. No. 7,141,977, the contents of which are incorporated herein by reference.

FIELD OF THE INVENTION

The present invention relates to an NMR (Nuclear Magnetic Resonance) analyzer and specifically to an NMR analyzer having a sample insertion port which enables a measurement sample to be inserted in the direction perpendicular to the main magnetic field.

BACKGROUND OF THE INVENTION

Figure 9:
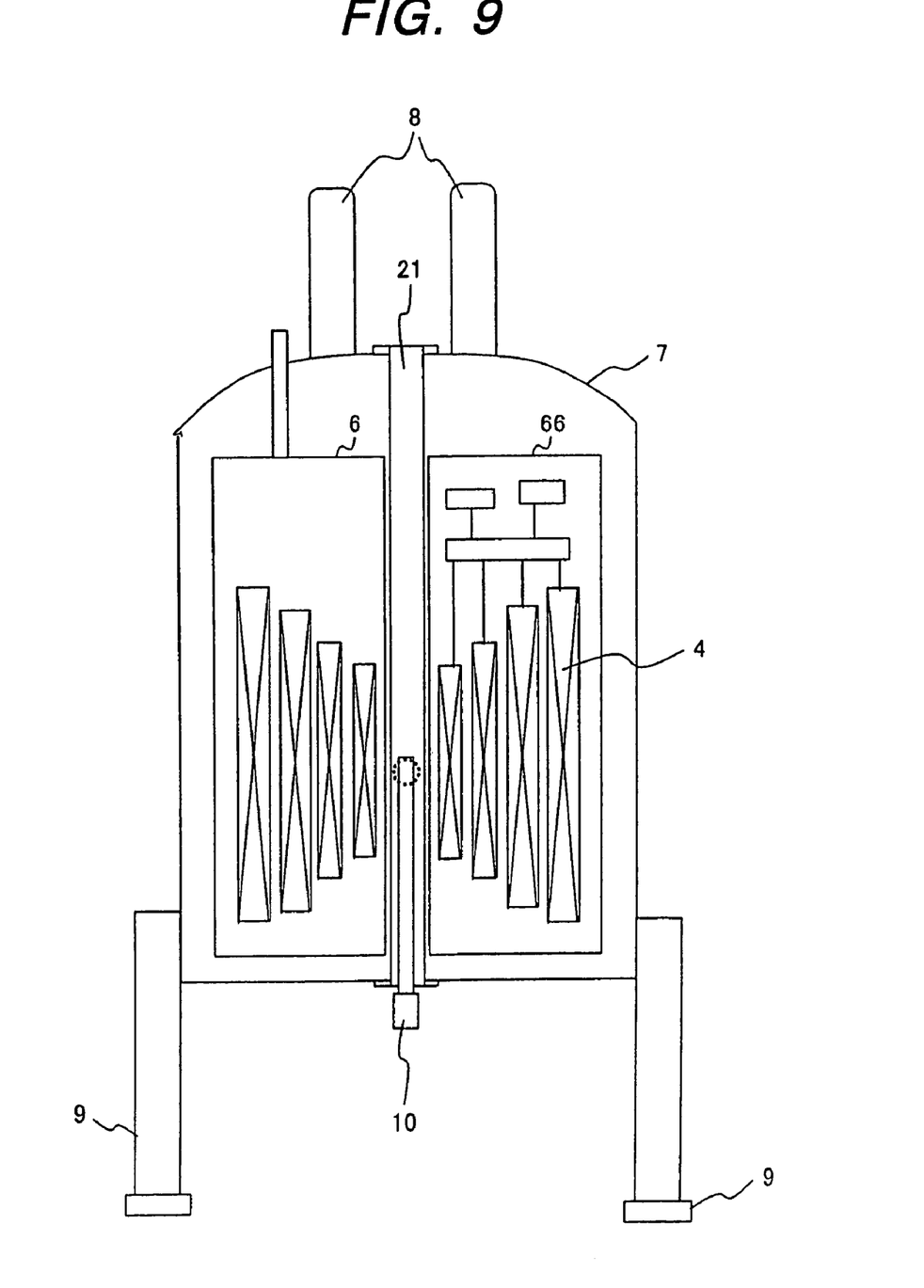
FIG. 9 is a schematic sectional view of a magnet for a conventional NMR analyzer.

Conventionally, a magnet for an NMR analyzer consists of coaxially nested, multilayer solenoid coils 4, as shown in FIG. 9, in which the magnetic axis is vertically oriented.

An access port 21 vertically passes through the magnet in the vicinity of the magnetic axis so that a sample can be inserted. A measurement sample is inserted from above and a probe 10 containing an antenna (coil) for detecting signals is inserted from below. A conventional NMR analyzer uses a saddle-type or bird-cage-type antenna (coil).

It is possible to improve detection sensitivity of the NMR signal by arranging the shapes of the sample and antenna (coil) and their positional relationships.

Figure 2:
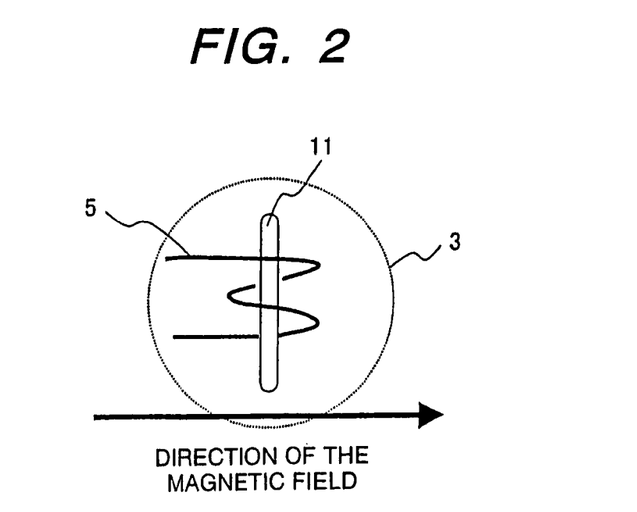
FIG. 2 is a schematic diagram showing the positional relationship among the magnetic field, sample and the solenoid-type detection coil.

FIG. 2 shows the positional relationships among a sample, detection coil and the magnetic field. "Document about NMR" by Yoji Arata, published by Maruzen, 2000, p.326 describes how the shape of the detection coil improves sensitivity. According to the document, by disposing a solenoid-type detection coil 5 having a coil axis (virtual axis) perpendicular to the main magnetic field generated by a magnet and disposing a sample 11 so that it passes through the coil 5, sensitivity can be increased at least 1.4 times more than the sensitivity when only coil shape is considered.

However, in conventional NMR analyzers, the configuration in which a sample is disposed perpendicularly to the direction of the main magnetic field to enable solenoid-type detection is not common and impossible except for a special purpose, for example, the use of a microprobe in which a solenoid-type detection coil is directly wound around an extremely small test tube containing a sample.

Japanese laid-open Patent Publication No. Hei 07-333311 discloses an example of a sample insertion method and the shape of a magnet which enables a sample to be positioned and the detection coil to be configured as mentioned above. The document describes a method in which a short-length sample 11 is mounted to a probe so that it is perpendicular to the magnetic axis, and the sample and the probe are together inserted into the magnet.

In this method, every time the sample is mounted and removed, the probe also has to be retrieved and inserted. Thus, operability is low, and also, there is the possibility that the probe will need to be adjusted every time it is retrieved and inserted. Thus, this method is not desirable.

Furthermore, because the length of the sample used is limited, it is difficult to embody a flow-type NMR analyzer in which samples are continuously and externally provided and moved through a sample injector. Also, replacement of a sample only, as disclosed in the document, is impossible in those cases where a solenoid-type antenna is used.

Here is another example. Although patent document 2 does not mention a method that improves sensitivity by using a solenoid-type antenna, it describes a split-type magnet. By using the described split-type magnet having an insertion port located in the magnet's gap, it is theoretically possible to dispose a sample, which passes through a solenoid-type antenna, at the center of the magnetic field so that the sample is perpendicular to the main magnetic field.

Japanese laid-open patent Publication No. Hei 07-240310 describes a method to dispose a sample and a probe in the magnet's gap. However, since the split-type magnet must have a gap, to obtain maximum strength in the magnetic field, electric current cannot flow through the most effective area. Accordingly, to generate the necessary strength in the central magnetic field, more current must flow through this magnet than the amount of current that flows through a magnet without a gap. Furthermore, to obtain necessary uniformity of the magnetic field, configuration of the coil is limited.

As a result, the diameter of the split-type magnet increases and the generated electromagnetic force also increases. In addition, to obtain necessary uniformity of the magnetic field, a coil that generates a magnetic field in the reverse direction of the main magnetic field must be installed. Thus, it is very difficulty to create such a magnet.

SUMMARY OF THE INVENTION

The first objective of the present invention is to provide a magnet for an NMR analyzer and an NMR analyzer using the magnet in order to improve NMR measurement sensitivity; and the magnet utilizes a solenoid-type detection coil and the configuration in which a measurement sample passes through the detection coil and is perpendicular to the main magnetic field is easily achieved.

The second objective of the present invention is to provide a magnet for an NMR analyzer which facilitates replacement of a sample.

The third objective of the present invention is to provide a magnet for an NMR analyzer that can measure the NMR of a sample while irradiating a light onto the sample.

In a magnet for an NMR analyzer according to a first aspect of the present invention, an electric conductor is wound around an axis 15 as a magnetic axis, and by turning on the electric conductor, a magnetic field that includes a measurement space 3 for conducting measurement is generated in the space surrounded by the electric conductor. The electric conductor is wound such that the magnet comprises a first access port 1 through which access from the outside of the magnet to the measurement space is possible via the vicinity of the axis, and a second access port 2 which enables access in the direction different from that of the first access port, and the electric conductor does not interfere with the area where first and second access ports are located. The effective diameter of the first and second access ports is defined as the diameter of a cylinder which can be inserted into the access port. When the sizes of the first and second access ports are compared based on the definition, the effective diameter of the second access port is smaller than that of the first access port.

In a magnet for an NMR analyzer according to a second aspect of the present invention, a first coil 41 in which an electric conductor is wound around an axis 15 as a magnetic axis is disposed facing a second coil 42 which is formed in the same manner as the first coil and wound around the same axis. A magnetic field that includes a measurement space 3 is formed inside the space surrounded by the first and second coils, and the magnet has a first access port 1 through which access to the measurement space 3 is possible in the direction of the axis 15.

Moreover, a second access port 2 which enables access in the direction different from that of the first access port is provided in a clearance between the first coil and the second coil. The effective diameter of the first and second access ports is defined as the diameter of a cylinder which can be inserted into the access port. When the sizes of the first and second access ports are compared based on the definition, the effective diameter of the second access port is smaller than that of the first access port. It is desirable that the effective diameter be 20 mmφ or less, and more preferably 10 mmφ or less.

A magnet for an NMR analyzer in accordance with a third aspect of the present invention is according to either the aspect 1 or 2, wherein the first and second access ports pass through the magnet.

A magnet for an NMR analyzer in accordance with a fourth aspect of the present invention is according to any one of the aspects 1 through 3 and comprises at least one superconducting coil.

A magnet for an NMR analyzer in accordance with a fifth aspect of the present invention is according to any one of the aspects 1 through 4, wherein the axis 15 is oriented horizontally.

Figure 7:
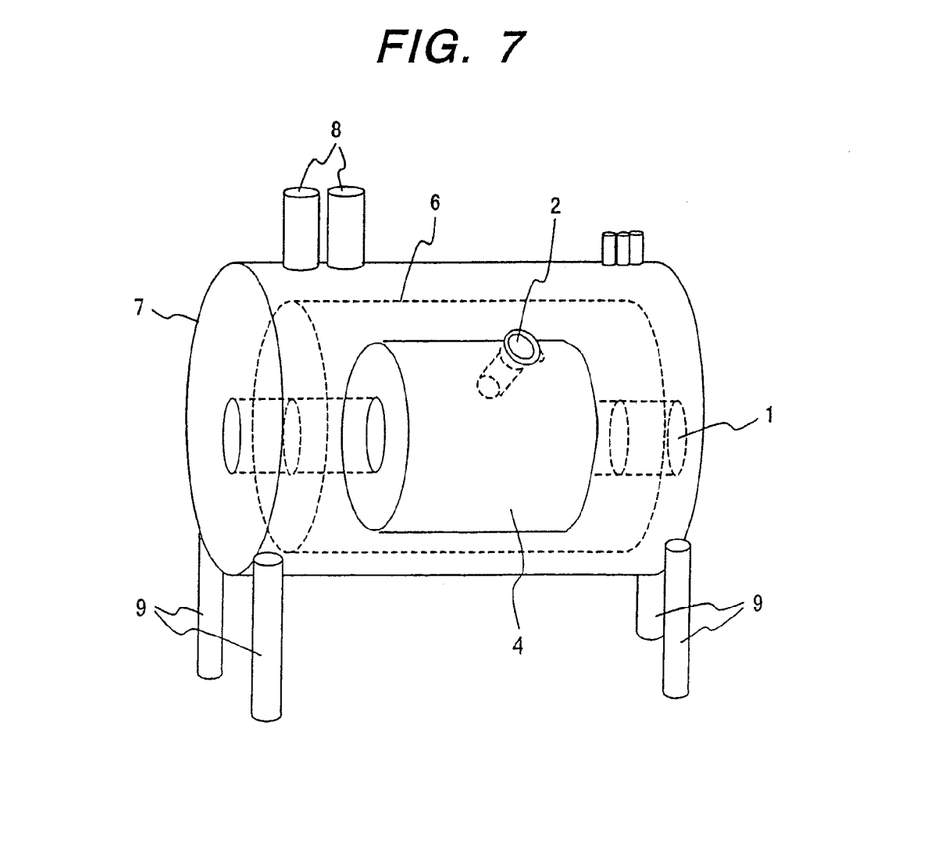
FIG. 7 is a schematic perspective sectional view of aspect 4 which is an example of the present invention.

A magnet for an NMR analyzer in accordance with an eighth aspect of the present invention is according to any one of the aspects 1 through 5, wherein the first access port 1 (see FIGS. 1 and 7) is oriented horizontally and the second access port 2 is not positioned vertically (see FIG. 7).

A magnet for an NMR analyzer in accordance with a seventh aspect of the present invention is according to any one of the aspects 1 through 6, and further comprises a third access port 22 (see FIG. 8) which is different from the first and second access ports.

Figure 8:
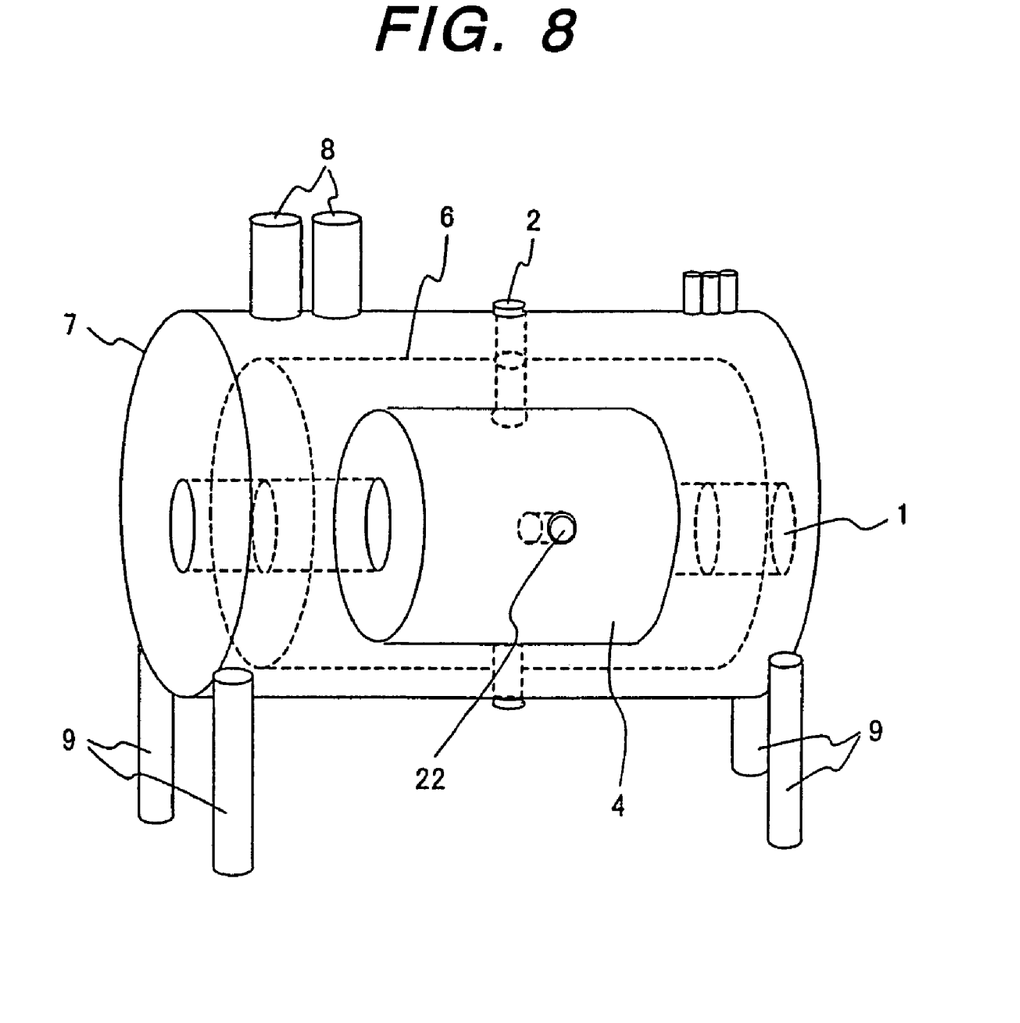
FIG. 8 is a schematic perspective sectional view of aspect 6 which is an example of the present invention.

A magnet for an NMR analyzer in accordance with an eighth aspect of the present invention is according to the aspect 7, wherein the third access port 22 passes through the measurement space 3 and passes through the magnet.

A magnet for an NMR analyzer in accordance with a ninth aspect of the present invention is according to any one of the aspects 1 through 8 and further comprises more than one access port having a non-circular sectional view.

An NMR analyzer in accordance with a tenth aspect of the present invention comprises a magnet according to any one of the aspects 1 through 9.

Figure 6:
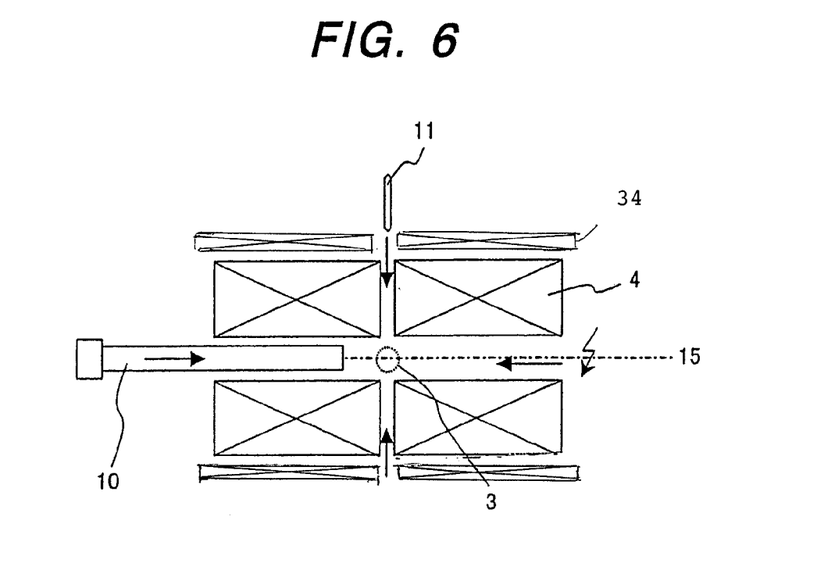
FIG. 6 is a conceptual diagram showing the positional relationship among the first and second access ports and the coil, and the directions in which the probe, sample and light are introduced.

An NMR analyzer in accordance with an eleventh aspect of the present invention is according to the aspect 10, wherein a probe 10 for measuring an NMR signal is inserted from a first access port 1, and a sample 11 to be measured (see FIG. 6) is inserted from a second access port 2 (see FIG. 1), and the positions of the probe and the sample meet in the measurement space 3 so that NMR measurement can be conducted.

An NMR analyzer in accordance with a twelfth aspect of the present invention comprises a magnet in which an electric conductor is wound around an axis 15 (see FIG. 4), and by turning on the electric conductor, a magnetic field that includes a measurement space 3 is generated in the space surrounded by the electric conductor; a first access port for accessing the measurement space 3 in the axial direction; and a second access port 2 which enables access in the different direction from the first access port 1, wherein a probe 10 for measuring an NMR signal is inserted from a first access port 1, and a sample 11 to be measured is inserted from a second access port 2, and the positions of the probe and the sample meet in the measurement space 3 so that NMR measurement can be conducted.

In an NMR analyzer in accordance with a thirteenth aspect of the present invention, a first coil 41 in which an electric conductor is wound around an axis is disposed facing a second coil 42 which is formed in the same manner as the first coil and wound around the same axis, and a magnetic field that includes a measurement space 3 is formed inside the space surrounded by the first and second coils (see FIG. 5); and The NMR analyzer further comprises a first access port 1 through which access to the measurement space 3 is possible in the direction of the axis 15 and a second access port 2 which enables access in the different direction from the first access port 1. A probe 10 for measuring an NMR signal is inserted from a first access port 1, and a sample 11 to be measured is inserted from a second access port 2, and the positions of the probe and the sample meet in the measurement space 3 so that NMR measurement can be conducted (see FIG.6). As shown, a shim coil group 34 is arranaed outside of the coils 4.

Figure 1:
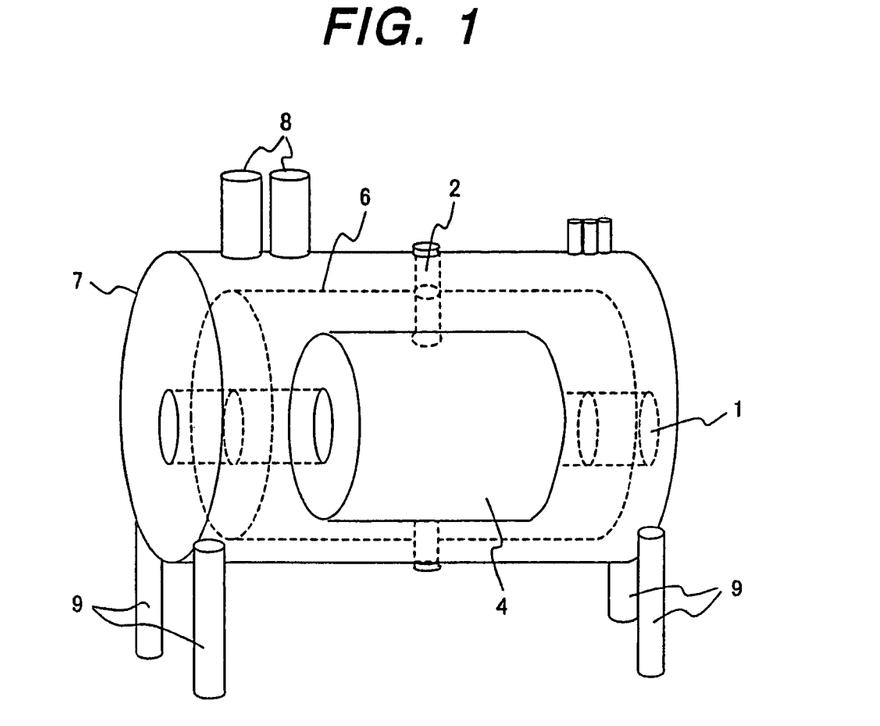
FIG. 1 is a schematic perspective view showing the configuration of the magnet according to the present invention.

In an NMR analyzer in accordance with a fourteenth aspect of the present invention, the second access port passes through the magnet (see FIGS. 1 and 8).

An NMR analyzer in accordance with a fifteenth aspect of the present invention is according to any one of the aspects 12 through 14, wherein the magnet comprises at least one superconducting coil.

An NMR analyzer in accordance with a sixteenth aspect of the present invention is according to any one of the aspects 12 through 14, wherein the magnet is positioned such that the axis 15 is oriented horizontally.

An NMR analyzer in accordance with a seventeenth aspect of the present invention is according to the invention 16, wherein the first access port 1 is oriented horizontally and the second access port 2 is not vertically oriented.

An NMR analyzer in accordance with an eighteenth aspect of the present invention is according to any one of the aspects 12 through 17, and further comprises a third access port 22 (see FIG. 8) different from the first and second access ports.

An NMR analyzer in accordance with a nineteenth aspect of the present invention is according to the aspect 18, wherein the third access port 22 passes through the measurement space 3 and passes through the magnet.

An NMR analyzer in accordance with a twentieth aspect of the present invention is according to any one of the aspects 12 through 19, and further comprises more than one access port having a non-circular sectional view.

The magnet according to the present invention has two access passages for accessing, from the outside of the coil, the measurement area 3 located inside the magnetic field surrounded by coil windings, and the first passage is positioned in the direction of the coil axis 15 and the second passage passes through a clearance 12 (see FIG. 4) in the coil winding portion.

A probe 10 (see FIG. 6) equipped with a solenoid-type detection coil 5 is inserted from the first passage so that the detection coil is positioned in the measurement space 3. Further, by positioning a sample in the measurement space 3 through the second passage, it is possible to position the sample so that it is perpendicular to the direction of the main magnetic field and also passes through the solenoid-type detection coil.

Furthermore, by providing a second passage, it is possible to take the sample in and out without taking the probe in and out.

The size of the access port to ensure the second passage is made as small as possible so that a sample can be inserted, and a clearance 12 provided in the coil winding portion is also minimized. This configuration makes it possible to minimize decrease in strength in the central magnetic field due to the presence of the clearance 12 and also to minimize turbulence of the uniformity of the magnetic field.

Therefore, an access port having a large effective diameter is regarded as a first access port and an access port having a smaller effective diameter is regarded as a second access port. The first access port is positioned on the magnetic axis and the second access port is positioned in the clearance between coil windings.

Furthermore, a probe 10 having a larger sectional area than that of a sample is inserted from the first access port, and the sample is inserted from the second access port, and their positions meet in the measurement space. This configuration makes it possible to make the NMR signal measurement highly sensitive compared to a magnet for a conventional NMR device without extremely increasing difficulty in designing of the magnet, cost and size.

By providing a configuration in which the second insertion port completely passes through the magnet, it is possible to insert a sample from one side and introduce an air flow for adjusting the sample's temperature and rotating the sample from the other side as done in a conventional NMR analyzer. Furthermore, the flow method enables the sample to be continuously or intermittently input and moved to the measurement space through a sample carrier pipe.

Since the first insertion port passes through the magnet, when a probe is inserted from one side, access to the sample from the other side is possible. Accordingly, it is possible to irradiate light (electromagnetic wave) or the like to the measurement sample through an access passage from the other side. As a consequence, it is possible to irradiate a ray of light (electromagnetic wave) onto a photoactive measurement sample and simultaneously measure NMR signals indicating the reaction.

Furthermore, by making a magnet using a superconducting coil, the strength in the magnetic field can be improved. Thus, it is possible to provide a temporally steady magnetic field by operating the magnet in the permanent current mode.

Moreover, by horizontally orienting an axis around which coils composing a magnet are wound, the center of gravity of the entire magnet can be lowered.

In a magnet for a conventional NMR analyzer, as shown in FIG. 9, the axis is oriented vertically. A probe is inserted from below along the axis. As a result, the position of the entire magnet is elevated and a sample insertion port is located at an elevated position.

By horizontally positioning a magnet, the entrance of the second access port at which a sample is inserted is lowered, thereby facilitating sample replacement.

However, even if a magnet is positioned horizontally, if the diameter of the magnet is large due to increase in strength in the magnet's magnetic field, sample replacement is not easy.

In that case, as shown in FIG. 7, by providing the second access port at an inclined angle from the vertical, the position of the sample insertion port can be lowered and also moved from the center of the magnet toward the edge, thereby increasing accessibility.

As shown in FIG. 8, it is also possible to increase accessibility to the measurement space 3 by providing a third access port 22 different from the first and second access ports. The third port can pass through the measurement space 3 and completely pass through the magnet. Therefore, it is possible to incorporate a device for irradiating a ray of light (electromagnetic wave) onto the measurement sample, detecting the transmitted or scattered light, and retrieving structure information of the sample.

When the second access port passes through the split-type magnet, the sectional area of the access port is made oval or rectangular instead of circular. This makes the sectional area of the access port large without increasing the size of the magnet's gap. Consequently, accessibility to the measurement space 3 increases.

DESCRIPTION OF THE PREFERRED EMBODIMENTS

[Embodiment 1]

Figure 3:
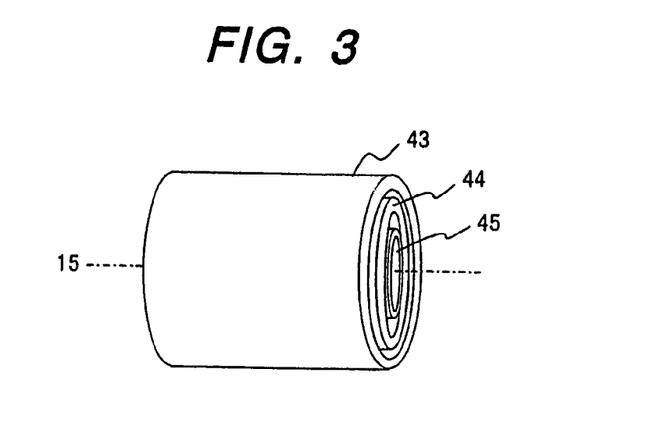
FIG. 3 is a schematic perspective view showing the concept of the coaxial multilayer solenoid configuration.
Figure 4:
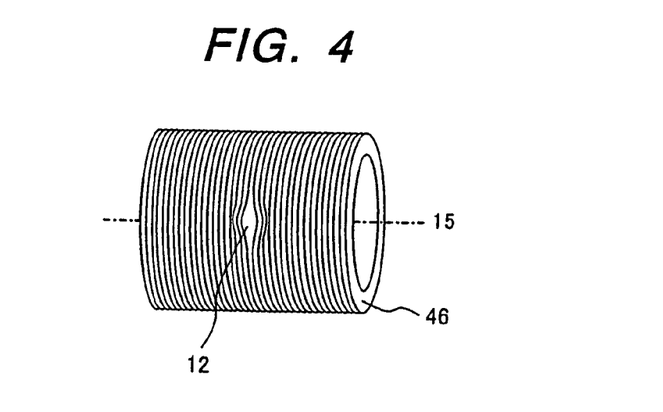
FIG. 4 is a schematic perspective view in which a clearance 12 for a second access port for sample insertion is formed in the coil winding portion.

As shown in FIG. 3, a multilayer coil group in which a plurality of coils 43, 44 and 45 are coaxially nested and wound is disposed so that the axis 15 is horizontal. As shown in FIG. 4, each coil is wound so that a clearance 12 is created in the central portion of each coil 46 to create a port for accessing the magnet's central portion.

The size of the clearance 12 in the central portion of the coil winding provided for ensuring a port is approximately 40 mm wide. The coil wire is wound such that the clearance is made as small as possible.

Furthermore, without disturbing the clearance, a shim coil group (not shown) is disposed outside the multilayer coil group to compensate for an axisymmetric and nonaxisymmetric error magnetic field. In addition, another shim coil group is disposed inside the multilayer coil.

In this embodiment, the multilayer coil group consists of nine coils (not shown). Three coils located radially on the outer side are wound with NbTi wire, and other coils are wound with $Nb_3Sn$ wire so that each coil is appropriately superconductive according to the strength in the magnetic field to which each coil is exposed.

Coils composing a multilayer coil group are superconductively connected in an electrical series circuit to form a current loop, and the multilayer coil group is put in motion by the permanent current mode.

The shim coil group located on the outer side is wound with NbTi wire and generates a magnetic field that compensates for X, Y, XY, X2-Y2, ZX and ZY terms which are generally expressed as kinds of an NMR magnet's error magnetic fields. The shim coil group located on the inner side is wound with $Nb_3Sn$ wire and generates a magnetic field that compensates for those error magnetic fields and also generates a higher-order compensation magnetic field.

The inner diameter of the coil group including shim coils is approximately 80 mm and the outer diameter is approximately 700 mm.

This configuration allows the magnet to generate a magnetic field in which the strength in the central magnetic field is 14.1 T (proton resonance frequency 600 MHz) and turbulence of the magnetic field inside the spherical surface with a diameter of 20 mm is 1 ppb or less, and the attenuation rate of magnetic field's strength is approximately 2 ppb/hour or less.

Coils need to operate immersed in liquid helium and they are placed inside the container 6 that contains liquid helium as a refrigerant. Furthermore, to reduce the amount of heat seepage into the liquid helium container 6, a radiation shield and a heat-insulating vacuum layer are formed outside the liquid helium layer and the liquid nitrogen layer (not shown) to cool the radiation shield is also provided.

The magnet has two access ports: one for radially accessing the measurement area located at the center of the magnet and the other for axially accessing the same area along the coil's axis. Each port forms a part of the aforementioned liquid helium container 6, radiation shield and heat-insulating vacuum layer, and the ports are also formed such that both access port meet in the central portion of the magnet.

Both access ports pass through the vacuum container, liquid helium container and the coil. Therefore, in the magnet, access to the measurement space 3 located in the central portion of the magnet is possible from four directions. The inner diameter of the axial access port is 54 mm, and the inner diameter of the radially access port is 20 mm.

An NMR analyzer mainly consists of a magnet for generating a uniform magnetic field, an antenna coil for detection, an RF radiation coil for irradiating electromagnetic waves, a mechanism for adjusting a sample's temperature, a mechanism for holding and rotating the sample, a signal processing device and a control device.

Among those components, in a conventional NMR analyzer, an antenna coil for detection, an RF (Radio Frequency) radiation coil, a mechanism for adjusting a sample's temperature and a mechanism for holding and rotating the sample are integrated into a probe and inserted into the magnet.

In the conventional NMR analyzer, as shown in FIG. 9, an access port 2 vertically passes through the magnet on the magnetic axis, and a probe 10 is generally inserted into the access port from below and a sample 11 is inserted into the access port from above.

In this embodiment, a probe 10 having an RF radiation coil and a solenoid-type detection antenna is axially inserted into the access port 1 (see FIG. 6) and a measurement sample contained in a 5 to 10 mm test tube is radially inserted into the access port 2 from above (see FIG. 1).

Furthermore, a gas flow mechanism for adjusting a measurement sample's temperature and a mechanism for rotating the sample are inserted into the access port 2 from below, and those mechanisms, the above-mentioned probe and sample meet in the measurement space 3 located in the central portion of the magnet.

An NMR analyzer requires a detection antenna (detection coil) to detect magnetization perpendicular to the main magnetic field. Therefore, the detection antenna (detection coil) must be positioned so as to detect magnetization generated in the direction of the magnet's radius.

In this embodiment, the axial direction of the detection antenna (solenoid-type coil 5) disposed in the measurement space 3 as shown in FIG. 2 is perpendicular to the direction of the magnet's main magnetic field.

By forming an access port for inserting a sample perpendicularly (magnet's radius direction) to the magnetic axis, it is possible to insert a sample 11 such that it passes through the detection antenna (solenoid-type coil 5).

As the result of inserting a sample 11 into such a location that the sample 11 passes through the solenoid-type detection antenna (solenoid-type coil 5), when compared to a saddle-type or bird-cage-type antenna used for a conventional NMR analyzer, the signal detection efficiency, which is determined by the shape of the coil and positional relationship between the coil and the sample, is at least 1.4 times more than that of the conventional NMR analyzer. Consequently, more sensitive measurement can be achieved.

There is another method for achieving the above-mentioned positional relationship between the sample and the detection antenna. In this method, instead of an access port provided in the direction of the magnet axis, an access port in the direction of the magnet's radius, which is the same as the above sample insertion port, is formed such that it is perpendicular to the sample insertion port, and the probe can be inserted from the access port.

However, in this case, since the diameter of the probe required for mounting an RF coil and a detection antenna inside the probe is approximately 40 to 50 mmφ and the diameter of the test tube containing the sample is approximately 3 to 10 mm, a clearance 12 formed in the coil winding portion must be made large. As the clearance 12 becomes large, it becomes difficult to make a uniform magnetic field necessary for the NMR measurement. Consequently, coil configuration becomes complicated and the strength in the central magnetic field decreases, thereby requiring a stronger magnetomotive force.

As a magnetomotive force increases, an electromagnetic force applied to the coil increases, and the strength in the magnetic field applied to the superconductive windings of the coil increases.

The superconductive windings can conduct electric current in the substantially superconductive state only when the strength in the magnetic field is below a certain level. In addition, to prevent the quenching phenomenon in which a superconductive state transfers to a normal conductive state due to fluctuations of the magnetic field caused by external disturbance or thermal generation caused by minor transfer of coil windings, it is important to ensure a margin of safety by reducing an applied magnetic field when designing a superconductive magnet.

Compared to the method in which a probe is inserted from a clearance in the central portion of the coil, this embodiment can reduce the number of coils from eleven to nine because it generates a magnetic field with a strength of 14.1 T while maintaining the uniformity. Consequently, the strength in the magnetic field which the coil withstands can be reduced from 16.2 T to 15.4 T, thereby reducing the stress value by approximately 30 MPa in an area where an electromagnetic force is severe.

In a probe for a conventional NMR analyzer, an RF radiation coil, a detection antenna, a mechanism for rotating a sample and a mechanism for adjusting the sample's temperature are integrated into one unit and installed. However, like this configuration, it is possible to install an RF radiation coil and a detection coil inside the probe and to separate both the mechanism for rotating a sample and the mechanism for adjusting the sample's temperature from the probe.

That configuration makes the mounting space inside the probe become wider, and limitation to the mounting of the RF radiation coil and the detection antenna is eased. As a result, the RF coil and the antenna can be more effective.

When using a cryoprobe in which a detection antenna is cooled to an extremely low temperature, it is possible to ensure a sufficient heat-insulating vacuum layer and a conductive cooling path. Therefore, operations under lower temperature (20 K to 5 K) than the operating temperature of the conventional probe are possible. As a result, S/N ratio of the NMR signal is improved, thereby making it possible to achieve a highly sensitive measurement that is almost twice as sensitive as the conventional measurement.

Since the axially provided probe insertion port passes through the magnet, access to the measurement space from the opposite side of the port is possible. This opposite-side access port can be used to introduce light when a photoactive sample is measured.

[Embodiment 2]

Figure 5:
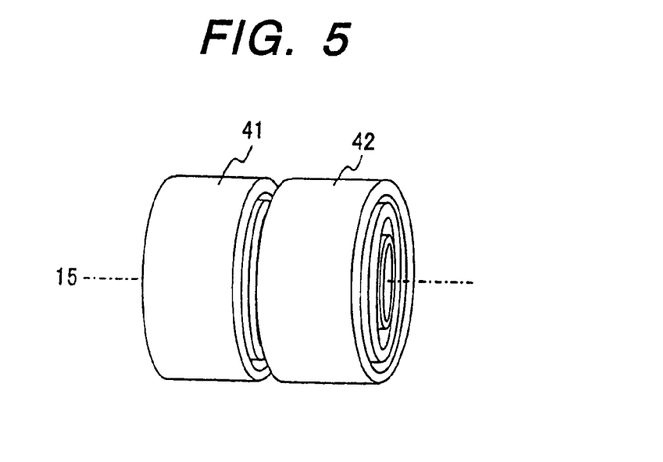
FIG. 5 is a schematic perspective view of the split-type magnet.

In embodiment 1, a coil is wound such that a clearance 12 is made in the central portion of the coil winding in order to create a sample insertion port. As an alternative, there is another method. In the method, instead of creating a clearance 12 in the central portion of the coil, as shown in FIG. 5, a solenoid coil group 1 (numeral 41 in FIG. 5) and a similar solenoid coil group 2 (numeral 42 in FIG. 5) both of which are wound around the same axis 15 are disposed with a given interval provided therebetween.

Coils used for this method are easy to make, and designing of the uniform magnetic field is also easy because the coil winding can be symmetrical. Also, a relatively uniform electromagnetic force can be applied, which is an advantage in terms of electromagnetic force resistance.

However, that configuration has the same effect as that resulted from the clearance between coils being made large, and the strength in the central magnetic field significantly decreases. Furthermore, in some cases, a coil for generating a reverse-direction magnetic field is necessary to generate a uniform magnetic field. For this reason, it is necessary to make a gap between the coil group 1 (41) and the coil group 2 (42) as small as possible.

In this embodiment, minimizing the gap for enabling the insertion of a measurement sample facilitates the generation of the uniform magnetic field.

[Embodiment 3]

In embodiment 1, the magnetic axis 15 is horizontally oriented. In the present invention, the direction in which a magnetic field is generated is not limited to the horizontal direction. In this embodiment, a magnetic field is vertically generated.

In a conventional NMR analyzer, replacement of a sample is inconvenient because a magnetic axis is vertically oriented and a sample is inserted from above (2 m or more above the floor surface). In the present invention, the sample insertion port is located in the central portion of the magnet. Therefore, the position at which a sample is inserted is 2 m or less, thereby making sample replacement easy.

When reducing a spread of the leak magnetic field generated by a magnet by using a magnetic shield (magnetic shield room) made of ferromagnetic material, it is desirable to place the ferromagnetic shields at symmetrical locations from the center of the magnet so as to ensure the uniformity of the magnetic field. In the magnet in which a magnetic field is generated horizontally, a shield has to be positioned under the floor. However, in the magnet in which a magnetic field is generated vertically, installation of the magnetic shield is relatively easy, which is an advantage.

[Embodiment 4]

In the aforementioned embodiment, the magnetic axis 15 is horizontally oriented and the sample insertion port is vertically oriented. However, all it takes to do is to position a sample insertion port such that a sample is inserted in the direction perpendicular to the magnetic axis, and it does not have to be vertically oriented.

In embodiment 1, the diameter of the magnet including the entire cryostat is approximately 1.6 m, and in the floor-type magnet, a sample insertion port is located at least 1.6 m above the floor surface. In this case, to replace a sample, it is necessary for someone to stand by the magnet, to stretch out an arm about 80 cm and to replace the sample at a position that is 1.6 m high.

As shown in FIG. 7, by providing a sample insertion port (second access port 2) at an inclined angle rather than being vertical, the entrance of the sample port is located closer to an operator and the height of the port is also lower, facilitating the sample replacement. In this case, the desirable angle of incline is 30 to 45 degrees from the vertical.

If the magnet (magnetic field generation means 4) is directly placed on the floor or it is installed near the floor surface, access is difficult to the bottom port which is opposite to the aforementioned sample insertion port. However, by providing a sample insertion port at an inclined angle from the vertical, it is possible to ensure a clearance between the magnet and the floor surface, thereby improving accessibility.

[Embodiment 5]

In embodiment 1, light can be introduced from an unused access port which is the other side of the probe insertion port so as to light the sample. This port is equipped with an electromagnetic wave radiation device for irradiating a far-infrared ray with a wavelength of 0.1 mm or less, visible ray, X-ray and so on.

Some kinds of protein are photoactive and their structure changes by the radiation of light. Therefore, this embodiment enables the NMR analyzer to measure photoactive reactions and structure changes.

[Embodiment 6]

In embodiment 1, a probe insertion port and a sample insertion port cross at right angles at the center of the magnet. However, as shown in FIG. 8, a third access port 22 can be provided which is different from the probe insertion port and the sample insertion port.

In embodiment 5, light (electromagnetic wave) can be introduced from an unused access port which is the other side of the probe insertion port. However, to install an analyzer for irradiating a ray of light onto a sample, detecting light transmitted or scattered from a sample and retrieving structure information of the sample, both a port for introducing light toward the sample and a port for detection are necessary. Those ports do not have to be positioned linearly, and they can be connected at a certain angle according to the transmitted or scattered light.

[Embodiment 7]

In embodiment 1, a sample is inserted into the second access port 2, which is a sample insertion port, from above, and gas for adjusting the sample's temperature and rotating the sample can be introduced from below. However, it is possible to install a sample carrier pipe at an access port for sample insertion so as to continuously and movably input measurement samples into the measurement space.

In the present invention, a clearance is formed in the coil winding portion, an access port 2 is provided through which a sample is inserted from the clearance into the measurement space 3 located at the center of the magnet, and another access port is also provided through which a probe is inserted into the measurement space along the magnetic axis. As a result, a measurement sample can pass through a solenoid-type detection coil during the NMR measurement and the sample can be perpendicular to the direction of the main magnetic field.

Furthermore, minimizing the size of the clearance 12 provided in the coil winding portion enables an effective magnet to be easily formed compared to the magnet having no clearance 12.

Since a sample can be inserted and removed without a probe being retrieved and inserted, it is possible to provide a magnet which facilitates sample replacement.

Moreover, by providing an access port, which is not occupied by a probe or a sample, to the measurement space, it is possible to provide an NMR measurement device which can externally introduce light for measurement.

Reference signs in the drawings show the following parts.
1 . . . first access port (for probe insertion), 2 . . . second access port (for sample insertion), 3 . . . measurement space, 4 . . . magnetic field generation means, 5 . . . solenoid-type detection coil, 6 . . . liquid helium container, 7 . . . vacuum container, 8 . . . current introducing port, 9 . . . anti-vibration support leg, 10 . . . probe, 11 . . . sample, 12 . . . clearance, . . . 15 . . . coil axis (virtual axis), 22 . . . third access port, 34 . . . shim coil group, 41, 42 . . . coaxial multilayer coil, 43, 44, 45, 46 . . . coil.

What is claimed is:

1. A magnet for an NMR analyzer comprising a superconductor coil for generating a magnetic field in a magnetic space surrounded by the superconductor coil, wherein the superconductor coil has a shim coil group disposed at least one of inside and outside of the superconducting coil, and the superconducting coil provides a first access port for receiving a probe inserted into the magnetic space along a central axis thereof and a second access port having one end for receiving a sample tube containing a sample inserted into the magnetic space in a direction transverse to the central axis of the magnetic space, the second access port being open at an other end thereof, wherein an effective diameter of the first access port is larger than an effective diameter of the second access port.

2. The magnet according to claim 1, wherein the second access port passes through the magnet.

3. The magnet according to claim 1, wherein the first access port is placed in a horizontal direction and the second access port is in an inclined direction with respect to a vertical direction.

4. The magnet according to claim 1, further comprising a third access port.

5. The magnet according to claim 4, wherein the third access port passes through the measurement space and the magnet.

6. A magnet for an NMR analyzer comprising a first superconductor coil and a second superconductor coil with a clearance therebetween, the first and second superconductor coils having a shim coil group disposed at least one of inside and outside thereof and being arranged on a common central axis, the first and second superconducting coils being operated to generate a magnetic field in a magnetic space surrounded by the first and second superconductor coils, and being configured to enable a detection antenna coil to be inserted into a measurement space in the magnetic space for analization, wherein the first and second superconductor coils provide a first access port for enabling access to the measurement space and a second access port for enabling a sample to be inserted into the measurement space in a direction which is transverse to the central axis of the magnetic space and which is transverse to a direction of the first access port, wherein an effective diameter of the first access port is lamer than an effective diameter of the second access port.

7. The magnet according to claim 6, wherein the common central axis of the measurement space is horizontal.

8. An NMR analyzer, which comprises the magnet for the NMR according to claim 6.

9. The NMR analyzer according to claim 8, wherein the second access port passes through the magnet.

10. The NMR analyzer according to claim 8, wherein the second access port is inclined with respect to a vertical direction.

11. The NMR analyzer according to claim 8, further comprising a third access port.

12. The NMR analyzer according to claim 11, wherein the third access port passes through the measurement space and the magnet.

13. An NMR analyzer for analyzing NMR signals, wherein a superconductor coil is operated in a permanent current mode so as to generate a magnetic field in a space surrounded by the superconductor coil and enables a sample to be inserted into a measurement space in the magnetic field, and wherein the superconductor coil provides a first access port for enabling access to the measurement space by a probe having a detection antenna coil and a second access port for enabling insertion of the sample into the measurement space, wherein an effective diameter of the first access port is larger than an effective diameter of the second access port.

14. An NMR analyzer for analyzing NMR signals, wherein a superconducting is operated to generate a magnetic field in a space surrounded by the superconductor coil and enables a sample to be inserted into a measurement space in the magnetic field, and wherein the superconductor coil has a shim coil group disposed at least one of inside and outside thereof and provides a first access port for enabling access to the measurement space by a probe having a detection antenna coil and a second access port for enabling insertion of the sample into the measurement space, wherein an effective diameter of the first access port is larger than an effective diameter of the second access port.

* * * * *